United States Patent
Lee et al.

(10) Patent No.: US 11,650,458 B2
(45) Date of Patent: May 16, 2023

(54) LIGHT EMITTING DEVICE WITH LIGHT EMITTING MEMBERS ON PRINTED CIRCUIT BOARD SUBSTRATE

(71) Applicant: SAMSUNG ELECTRONICS CO., LTD., Suwon-si (KR)

(72) Inventors: Dongsoo Lee, Seongnam-si (KR); Seogho Lim, Seongnam-si (KR); Changho Shin, Incheon (KR); Jongpil Won, Hwaseong-si (KR); Sangsu Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 246 days.

(21) Appl. No.: 17/077,302

(22) Filed: Oct. 22, 2020

(65) Prior Publication Data

US 2021/0351165 A1    Nov. 11, 2021

(30) Foreign Application Priority Data

May 8, 2020   (KR) .......................... 10-2020-0055376

(51) Int. Cl.
| | | |
|---|---|---|
| *H01L 25/075* | (2006.01) | |
| *H01L 33/60* | (2010.01) | |
| *G02F 1/13357* | (2006.01) | |
| *H05K 1/02* | (2006.01) | |

(Continued)

(52) U.S. Cl.
CPC .. *G02F 1/133611* (2013.01); *G02F 1/133603* (2013.01); *G02F 1/133605* (2013.01); *G02F 1/133606* (2013.01); *H01L 25/0753* (2013.01); *H01L 33/60* (2013.01); *H05K 1/0274* (2013.01); *G02F 1/133607* (2021.01); *H05K 1/181* (2013.01); *H05K 2201/10106* (2013.01)

(58) Field of Classification Search
CPC ........ G02F 1/133611; G02F 1/133603; G02F 1/133605; G02F 1/133606; G02F 1/133607; H01L 25/0753; H01L 33/60; H05K 1/0274; H05K 1/181
See application file for complete search history.

(56) References Cited

U.S. PATENT DOCUMENTS

| | | |
|---|---|---|
| 7,728,343 B2 | 6/2010 | Fujino et al. |
| 9,312,458 B2 | 4/2016 | Park et al. |
| 10,090,441 B2 | 10/2018 | Yamada et al. |

(Continued)

FOREIGN PATENT DOCUMENTS

| | | | | |
|---|---|---|---|---|
| CN | 106775076 A | * | 5/2017 | ............. G06F 3/041 |
| CN | 207584473 U | * | 7/2018 | |

(Continued)

OTHER PUBLICATIONS

CN207584473, Wang, Jun. 2018 machine translation (Year: 2018).*

(Continued)

*Primary Examiner* — Tracie Y Green
(74) *Attorney, Agent, or Firm* — Lee IP Law, P.C.

(57) ABSTRACT

A light emitting device includes a printed circuit board (PCB) substrate, a first ink layer covering the PCB substrate, the first ink layer having a first refractive index, light emitters on the first ink layer, and a second ink layer on the first ink layer and spaced apart from the light emitters, the second ink layer having a second refractive index different from the first refractive index.

20 Claims, 9 Drawing Sheets

(51) Int. Cl.
*H05K 1/18* (2006.01)
*G02F 1/1335* (2006.01)

(56) References Cited

U.S. PATENT DOCUMENTS

| | | | |
|---|---|---|---|
| 10,252,674 B2 | 4/2019 | Park et al. | |
| 10,439,112 B2* | 10/2019 | Clark | F21V 21/00 |
| 10,600,939 B2* | 3/2020 | Yuan | C09K 11/02 |
| 2011/0116152 A1* | 5/2011 | Guigan | B29D 11/00432 |
| | | | 359/619 |
| 2014/0218938 A1* | 8/2014 | Ouderkirk | F21V 1/17 |
| | | | 264/21 |
| 2015/0036379 A1* | 2/2015 | Lee | G02B 6/005 |
| | | | 362/606 |
| 2015/0091029 A1* | 4/2015 | Funakubo | H01L 25/0753 |
| | | | 257/89 |
| 2016/0161089 A1 | 6/2016 | Jeon et al. | |
| 2016/0221293 A1* | 8/2016 | Park | B32B 37/14 |
| 2018/0031912 A1* | 2/2018 | Zhang | G02F 1/1335 |
| 2018/0051863 A1* | 2/2018 | Lee | G02B 19/0014 |
| 2019/0193638 A1 | 6/2019 | Park et al. | |
| 2020/0254799 A1* | 8/2020 | Umebayashi | C09D 11/107 |
| 2022/0082226 A1* | 3/2022 | Park | F21S 41/285 |

FOREIGN PATENT DOCUMENTS

| | | | |
|---|---|---|---|
| JP | 4107349 B2 | | 6/2008 |
| JP | 5496072 B2 | | 5/2014 |
| JP | 2017028190 A | * | 2/2017 |
| JP | 2018-207048 A | | 12/2018 |
| KR | 10-0861123 B1 | | 9/2008 |
| KR | 1020140132571 | * | 11/2014 |
| KR | 10-1700902 B1 | | 1/2017 |
| KR | 10-1794918 B1 | | 11/2017 |
| KR | 10-2019-0049663 A | | 5/2019 |
| KR | 10-1987339 B1 | | 6/2019 |
| KR | 10-2130668 B1 | | 7/2020 |

OTHER PUBLICATIONS

JP2017028190, Dai nippon printing, Feb. 2017, machine translation (Year: 2017).*

Chang, KR1020140132571, Nov. 2014, machine translation (Year: 2014).*

* cited by examiner

LIGHT EMITTING DEVICE WITH LIGHT EMITTING MEMBERS ON PRINTED CIRCUIT BOARD SUBSTRATE

CROSS-REFERENCE TO RELATED APPLICATION

Korean Patent Application No. 10-2020-0055376, filed on May 8, 2020, in the Korean Intellectual Property Office, and entitled: "Light Emitting Device," is incorporated by reference herein in its entirety.

BACKGROUND

1. Field

Example embodiments relate to a light emitting device. More particularly, example embodiments relate to a light emitting device including a plurality of light emitting members mounted on a printed circuit board (PCB) substrate.

2. Description of the Related Art

In general, a light emitting device used in a lighting device may include a plurality of light emitting members mounted on a PCB substrate. The light emitting device may include a light emitting portion, in which the light emitting members are disposed, and a non light emitting portion having no light emitting members, e.g., between the light emitting members.

SUMMARY

According to example embodiments, there is provided a light emitting device that may include a PCB substrate, a first ink layer covering the PCB substrate, light emitting members on the first ink layer, and a second ink layer on the first ink layer to be spaced apart from the light emitting member. The first ink layer may have a first refractive index. The second ink layer may have a second refractive different from the first refractive index.

According to example embodiments, there is provided a light emitting device that may include a PCB substrate, a first ink layer covering the PCB substrate, light emitting members on the first ink layer, a lens disposed on the first ink layer to be spaced apart from the light emitting member, and at least one ink layer on the first ink layer, the ink layer disposed at an outside of the lens. The first ink layer may have a first refractive index and a first reflectivity. The lens may cover the light emitting member, and each of upper and lower surfaces of the lens may have a semi-spherical shape. An ink layer directly on the first ink layer may have a second refractive index different from the first refractive index and a second reflectivity different from the first reflectivity.

According to example embodiments, there is provided a light emitting device that may include a PCB substrate, a first ink layer covering the PCB substrate, an LED package on the first ink layer, and a second ink layer on at least portion of the first ink layer to be spaced apart from the LED package. The first ink layer may have a first refractive index and a first reflectivity. The second ink layer may have a second refractive different from the first refractive index and a second reflectivity higher than the first reflectivity.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
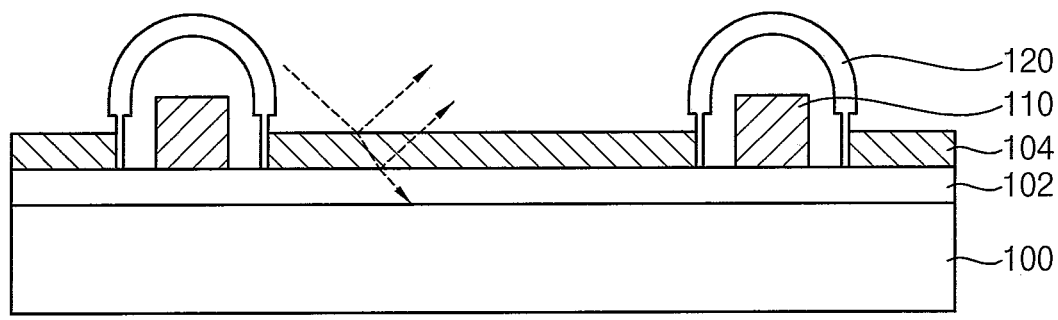
FIGS. 1 and 2 are a cross-sectional view and a plan view, respectively, of a light emitting device in accordance with example embodiments.
Figure 2:
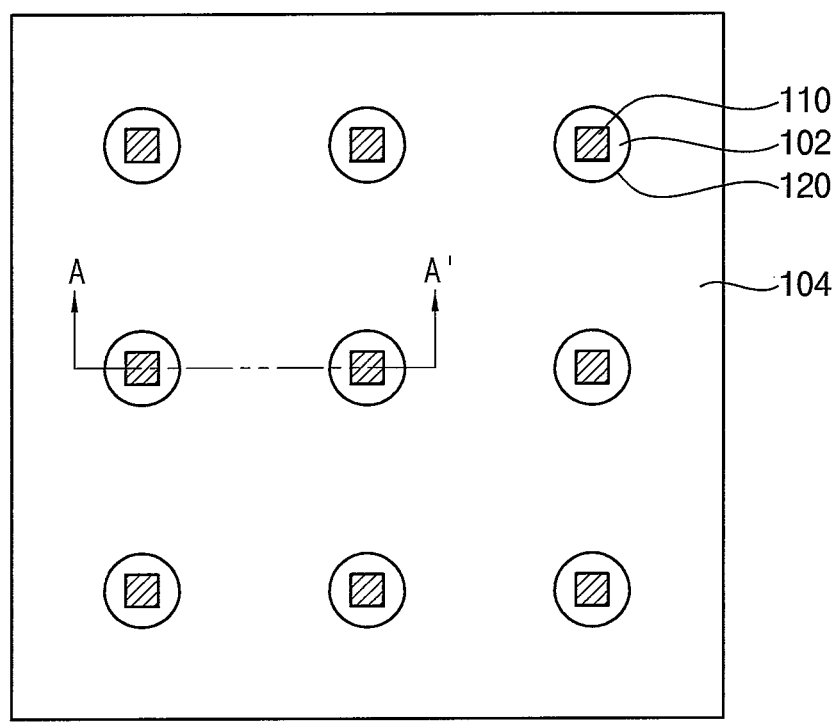

FIGS. 1 and 2 are a cross-sectional view and a plan view, respectively, of a light emitting device in accordance with example embodiments. FIG. 1 is a cross-sectional view along line A-A' of FIG. 2.

Referring to FIGS. 1 and 2, the light emitting device may include a PCB substrate 100, a first ink layer 102, a second ink layer 104, light emitting members 110, and lenses 120.

The PCB substrate 100 may include electrical circuits, e.g., a driving IC, a power connector, and a protection device, etc. In example embodiments, the PCB substrate 100 may include a base substrate, in which a copper thin film is stacked on an aluminum layer while insulated from the aluminum layer, and electrical circuit patterns on the base substrate.

The first ink layer 102 may be formed on the PCB substrate 100. The first ink layer 102 may cover, e.g., an entire upper surface of, the PCB substrate 100, so that the first ink layer 102 may protect the electric circuit patterns formed on the PCB substrate 100. The electric circuit patterns in the PCB substrate 100 may be insulated from each other by the first ink layer 102. In example embodiments, the first ink layer 102 may only expose electrodes for electrically connecting the light emitting members 110 formed on the PCB substrate 100. Thus, the light emitting members 110 may be disposed on an upper surface of the first ink layer 102.

The first ink layer 102 may include a material having a first refractive index and a first reflectivity. A thickness of the first ink layer 102, e.g., along a direction normal to the upper surface of the PCB substrate 100, may be in a range of about 10 μm to about 40 μm. When the thickness of the first ink layer 102 is less than 10 μm or greater than 40 μm, cost for manufacturing the light emitting device may increase and mass productivity may be degraded.

The first ink layer 102 may include an epoxy resin, and may further include a curing agent and a pigment. The first ink layer 102 may include a thermosetting polymer and/or a photo-polymer. The first ink layer 102 may include a white pigment (e.g., TiO$_2$) to increase reflectivity. In example embodiments, the first ink layer 102 may include a photo solder resist (PSR) ink.

Hereinafter, each of ink layers and ink layer patterns may include the epoxy resin, and may further include a curing agent and a pigment. For example, each of the ink layers and the ink layer patterns may use the PSR ink.

The second ink layer 104 may be formed on the first ink layer 102, e.g., the first ink layer 102 may be between the PCB substrate 100 and the second ink layer 104. The second ink layer 104 may have a second refractive index different from the first refractive index. A difference between the refractive indices of the first and second ink layers 102 and 104, i.e., a difference between the first and second refractive indices, may be about 0.1 or more.

In addition, the second ink layer 104 may have a second reflectivity different from a first reflectivity. In general, when two ink layers have different refractive indices, reflectivities of the two ink layers may also be different from each other. A thickness of the second ink layer 104, e.g., along a direction normal to the upper surface of the PCB substrate 100, may be in a range of about 10 µm to about 40 When the thickness of the second ink layer 104 is less than 10 µm or greater than 40 cost for manufacturing the light emitting device may increase and mass productivity may be degraded.

The second ink layer 104 may not be formed on an upper surface portion of the first ink layer 102 for mounting the light emitting members 110 and the lenses 120. For example, as illustrated in FIG. 1, the second ink layer 104 may be formed, e.g., only, on portions of the upper surface of the first ink layer 102 between adjacent ones of the light emitting members 110. Thus, the light emitting members 110 may not be disposed on the upper surface of the second ink layer 104. That is, the second ink layer 104 may, e.g., continuously, cover an entire surface of the first ink layer 102 outside of the lenses 120, e.g., the second ink layer 104 may cover an entire upper surface of the first ink layer 102 that has a non-overlapping relationship with the lenses 120 along a vertical direction. The second ink layer 104 may include openings in which the light emitting members 110 and the lenses 120 are mounted.

At least two ink layers 102 and 104 may be stacked on the PCB substrate 100. As a plurality of ink layers is stacked, reflectivity of light from an ink layer structure including stacked ink layers may be increased.

In example embodiments, each of the ink layers may have a thickness of about 10 µm to about 40 In example embodiments, a total thickness in a vertical direction of the ink layer structure, i.e., a combined thickness of all the ink layers, may be in a range of about 20 µm to 120 µm. Even if the thickness of the ink layer structure is greater than 120 µm, the reflectivity of light may not be further increased.

In order to increase the reflectivity of light from the ink layer structure, a difference between refractive indices of two ink layers in contact with each other may be 0.1 or more. Further, an uppermost ink layer included in the ink layer structure may serve as an incident surface of light, so that the uppermost ink layer may have a highest reflectivity among the ink layers in the ink layer structure. In the present embodiment, as shown in FIG. 1, the second ink layer 104 is the uppermost ink layer, and thus the second reflectivity may be higher than the first reflectivity.

The light emitting members 110 (i.e., light emitters 110) may be formed on the first ink layer 102. The light emitting members 110 may be mounted on the PCB substrate 100. Each of the light emitting members 110 may be positioned in a respective opening of the second ink layer 104, e.g., so the second ink layer 104 may surround a perimeter of each light emitting member 110 on the first ink layer 102, and may be electrically connected to the electrode on the PCB substrate 100.

The light emitting member 110 may be a light emitting diode (LED) package including a LED chip. For example, the LED chip may include an n-type semiconductor layer, a light emitting layer, and a p-type semiconductor layer sequentially stacked on a substrate including sapphire. The n-type semiconductor layer may be a GaN layer doped with n-type impurities. The p-type semiconductor layer may be a GaN layer doped with p-type impurities. An upper surface of the light emitting member 110 may be an emission surface of light.

In example embodiments, a plurality of the light emitting members 110 may be formed on the PCB substrate 100, and the light emitting members 110 may be disposed in a matrix shape.

The lenses 120 may be formed on the first ink layer 102 to cover each of the light emitting members 110. The lens 120 may be formed in a respective opening of the second ink layer 104 to overlap a top of a respective light emitting member 110, e.g., the lens 120 may completely overlap the top of a respective light emitting member 110. In example embodiments, each of upper and lower surfaces of the lens 120 may have a semi-spherical shape. The lens 120 may be spaced apart from an outer surface of the light emitting member 110. Therefore, the lens 120 may not directly contact the light emitting member 110.

Light emitted from the light emitting member 110 may be uniformly and radially diffused by the lens 120. The lens 120 may include a transparent silicone resin.

As described above, the light emitting device may have a COB (chip on board) structure.

When the light emitting members 110 are arranged in a matrix shape on the PCB substrate 100, the first ink layer 102 may be formed under bottom surfaces of the light emitting members 110. The stacked first and second ink layers 102 and 104 may be formed between the lenses 120 covering the light emitting members 110.

Light may be emitted from a first portion, i.e., a light emitting portion, where the light emitting members 110 are formed, and may not be emitted from a second portion, i.e., a non light emitting portion, where light emitting members 110 are not formed. The second portion, i.e., the non light emitting portion, may be formed between adjacent ones of the light emitting members 110 and/or between the light emitting members 110 and an edge of the PCB substrate 100. While luminance may be different depending on the positions of the PCB substrate 100, some of the light emitted from the light emitting member 110 may be incident backward, e.g., emitted in a direction toward the PCB substrate (dashed line in FIG. 1), to be reflected as much as possible, thereby increasing a quantity of light emitted from the non light emitting portion. Therefore, the quantity of light may be uniform at the different positions of the PCB substrate 100, and thus the light emitting device may have uniform luminance.

In detail, according to embodiments, the light incident, e.g., emitted, backward from the light emitting members 110 toward the PCB substrate 100 may be incident on the second ink layer 104 in regions between the light emitting members 110, i.e., on the second portion (i.e., the non light emitting portion) of the PCB substrate 100 (dashed arrow in FIG. 1). Such light that is incident, e.g., emitted, backward may be reflected from the surface of the second ink layer 104 or transmitted into the second ink layer 104. The transmitted light may be re-reflected at an interface between the second ink layer 104 and the first ink layer 102 or may be transmitted into the first ink layer 102. As the first and second ink layers 102 and 104 have different refractive indices and/or reflectivities from each other, the light may be sufficiently re-reflected at the interface between the second ink layer 104 and the first ink layer 102.

The light incident backward may be reflected at the surface of the second ink layer 104 and at the interface between the second ink layer 104 and the first ink layer 102 to be emitted from the second portion (i.e., the non light emitting portion) of the PCB substrate 100 between the light emitting members 110. Accordingly, the quantity of the reflected light emitted from the second portion (i.e., the non light emitting portion) of the PCB substrate 100 between the light emitting members 110 is greatly increased, thereby increasing overall luminance uniformity in the light emitting device.

In example embodiments, the light emitting device may be used as a backlight unit of a display device. In this case, a moire phenomenon and/or a blur phenomenon of the display device may be reduced.

Figure 3:
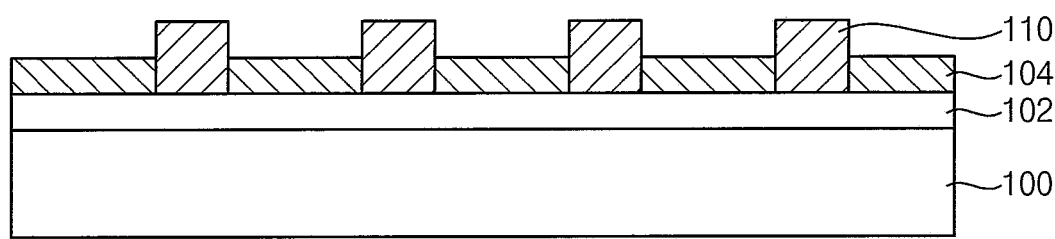
FIGS. 3 and 4 are a cross-sectional view and a plan view, respectively, of a light emitting device in accordance with example embodiments.
Figure 4:
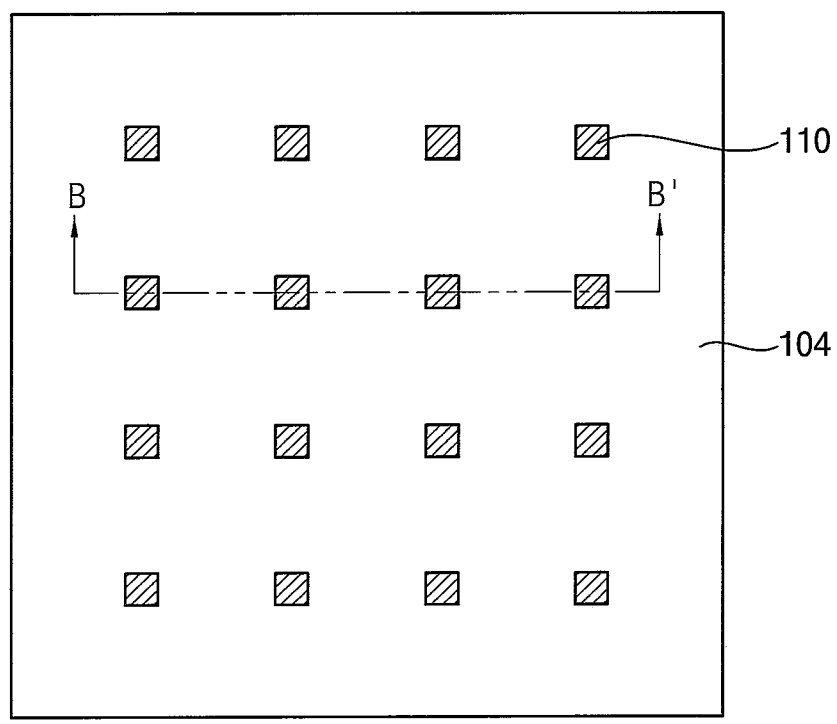

FIGS. 3 and 4 are a cross-sectional view and a plan view, respectively, of a light emitting device in accordance with example embodiments. FIG. 3 is a cross-sectional view along line B-B' of FIG. 4. The light emitting device illustrated in FIGS. 3 and 4 may be substantially the same as the light emitting device illustrated in FIG. 1, except that a lens is not included.

Referring to FIGS. 3 and 4, the light emitting device may include the PCB substrate 100, the first ink layer 102, the second ink layer 104, and the light emitting members 110.

The second ink layer 104 may not be formed on an upper surface portion of the first ink layer 102 for mounting the light emitting members. That is, the second ink layer 104 may cover the first ink layer 102 outside of each of the light emitting members 110. The second ink layer 104 may include an opening in which the light emitting members 110 are mounted. For example, as illustrated in FIG. 3, since lenses are not formed on the light emitting members 110, the second ink layer 104 may contact a lower part of a side surface of each of the light emitting members 110.

The light emitting member 110 may be an LED package including a light emitting diode (LED) chip. In example embodiments, the LED package may be a chip scale package (CSP). The LED package may include an encapsulant covering the LED chip. The encapsulant may include a transparent silicone resin. The encapsulant may have a semispherical upper surface, and thus the encapsulant may serve the lens.

Hereinafter, the light emitting devices including lens are described. However, similarly to those shown in FIGS. 3 and 4, each of the light emitting devices may not include the lens.

Figure 5:
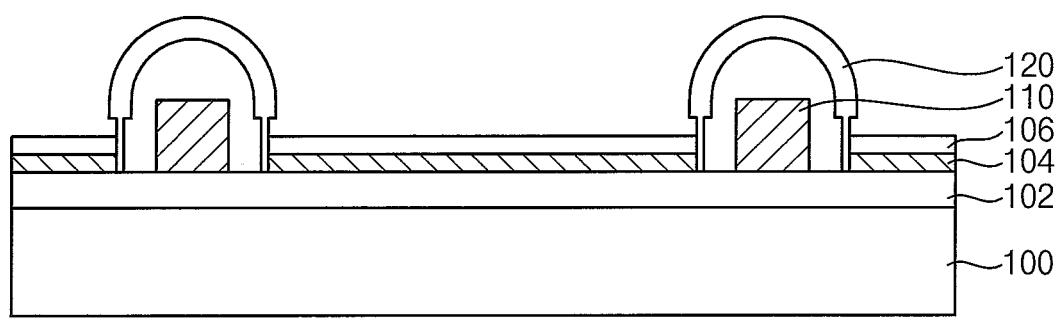
FIG. 5 is a cross-sectional view of a light-emitting device in accordance with example embodiments.

FIG. 5 is a cross-sectional view of a light-emitting device in accordance with example embodiments. The light emitting device shown in FIG. 5 may be substantially the same as the light emitting device shown in FIG. 1, except that an additional ink layer is further formed on the second ink layer.

Referring to FIG. 5, the light emitting device may include the PCB substrate 100, the first ink layer 102, the second ink layer 104, a third ink layer 106, the light emitting members 110, and the lenses 120.

The third ink layer 106 may be formed on the second ink layer 104. The third ink layer 106 may have a refractive index and a reflectivity different from a refractive index and a reflectivity of an ink layer directly contacting a lower surface of the third ink layer 106. That is, the third ink layer 106 may have a refractive index different from that of the second ink layer 104. In addition, the third ink layer 106 may have a reflectivity different from that of the second ink layer 104.

For example, the third ink layer 106 may include a material different from a material of the first ink layer 102. In this case, the third ink layer 106 may have a different refractive index and/or a reflectivity from those of the first ink layer 102. In another example, the third ink layer 106 may include a same material as the first ink layer 102. In this case, the third ink layer 106 may have the same refractive index and reflectivity as those of first ink layer 102.

The third ink layer 106 may not be formed on portions where the light emitting members 110 and the lens 120 are mounted, e.g., the second and third ink layers 104 and 106 may completely overlap each other and portions of the first ink layer 102 outside the lenses 120. That is, the second and third ink layers 104 and 106 may include openings in which the light emitting members 110 and the lenses 120 are mounted. Each of openings may pass through the second and third ink layers 104 and 106.

Each of the ink layers may have a thickness of about 10 μm to about 40 μm. A total thickness of an ink layer structure including all the stacked ink layers may be, e.g., about 20 μm to about 120 μm. In order to increase the reflectivity of light from the ink layer structure, a difference between refractive indices of two ink layers in contact with each other may be 0.1 or more.

In order to increase the reflectivity of light from the ink layer structure, an uppermost ink layer may have a highest reflectivity among the ink layers in the ink layer structure. In the present embodiment, as shown in FIG. 5, the third ink layer 106 is the uppermost ink layer. Thus, the reflectivity of the third ink layer 106 may have a highest reflectivity among the ink layers in the ink layer structure.

In some example embodiments, at least one additional ink layer may be further formed on the third ink layer 106. The additional ink layer may have a refractive index different from that of an ink layer disposed immediately therebelow. In addition, the additional ink layer may have a reflectivity different from that of an ink layer disposed immediately therebelow.

For example, the additional ink layer formed on the third ink layer 106 may have a refractive index and a reflectivity different from each of those of the first to third ink layers. In another example, the second ink layer 104 and the third ink layer 106 may be alternately stacked on the third ink layer 106. In yet another example, the first ink layer 102 and the second ink layer 104 may be alternately stacked on the third ink layer 106.

Figure 6:
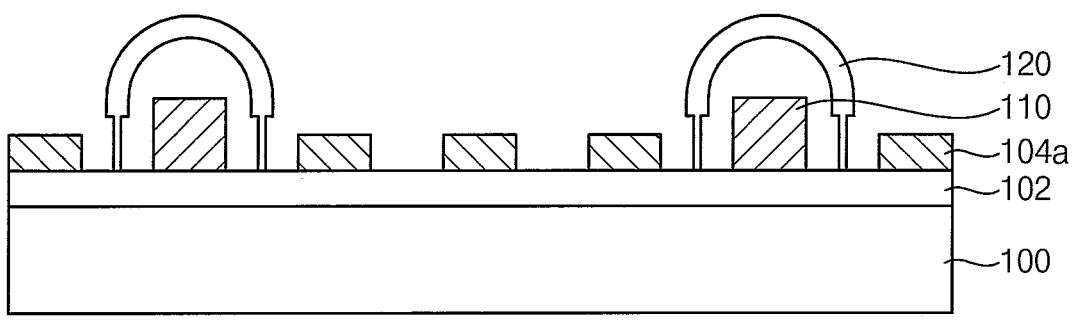
FIGS. 6, 7 and 9 are cross-sectional views of light emitting devices in accordance with example embodiments, respectively.
Figure 7:
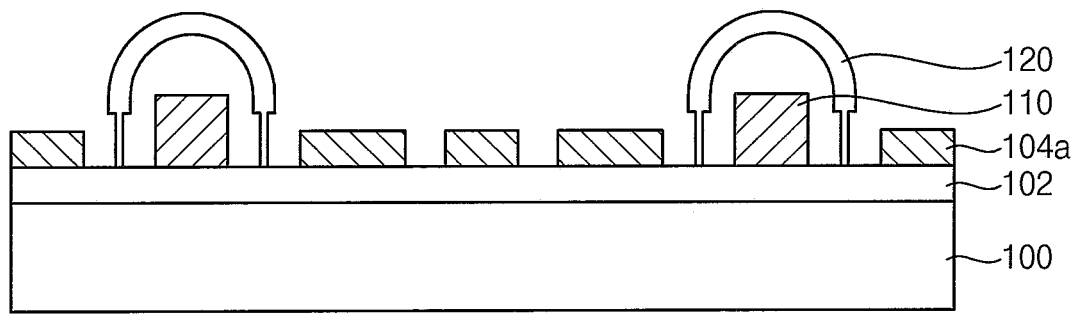
Figure 8:
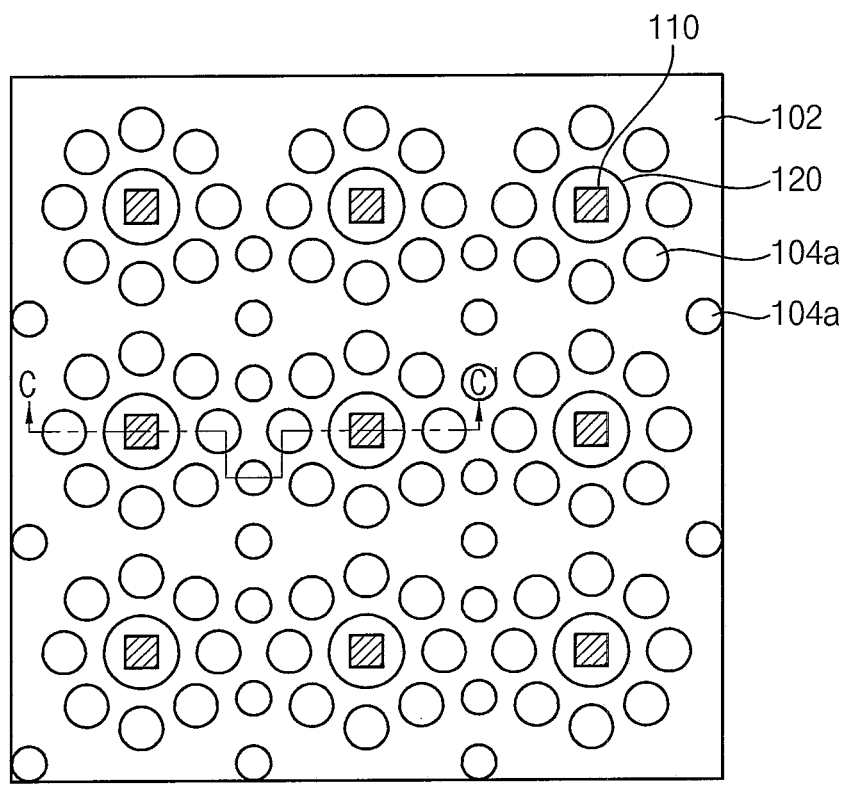
FIG. 8 is a plan view of a light emitting device in accordance with example embodiments.
Figure 9:
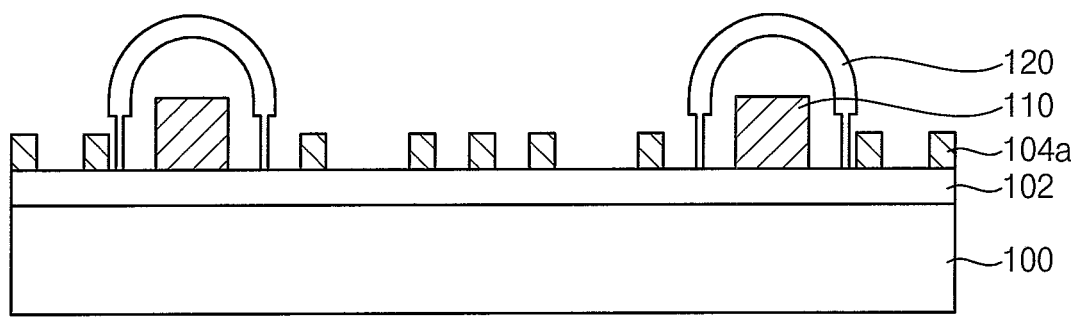

FIGS. 6, 7 and 9 are cross-sectional views of light emitting devices in accordance with example embodiments, respectively. FIG. 8 is a plan view of a light emitting device in accordance with example embodiments. FIG. 7 is a cross-sectional view along line C-C' of FIG. 8.

Each of the light emitting devices shown in FIGS. 6 to 9 may be the same as the light emitting device shown in FIG. 1, except that second ink layer patterns are formed on the first ink layer 102. The light emitting devices shown in FIGS. 6 to 9 may be substantially same, except for a shape and an arrangement of the second ink layer patterns.

Referring to FIGS. 6 to 9, the light emitting device may include the PCB substrate 100, the first ink layer 102, second ink layer patterns 104a, the light emitting members 110, and the lenses 120.

The second ink layer patterns 104a may be formed on the first ink layer 102. The second ink layer patterns 104a may be formed on upper surface portions of the first ink layer 102 to be spaced apart from sides of the light emitting members 110. The second ink layer patterns 104a may have a second refractive index different from a first refractive index of the first ink layer 102. In addition, the second ink layer patterns 104a may have a second reflectivity different from a first reflectivity of the first ink layer 102. Each of the second ink layer patterns 104a may have a thickness of about 10 μm to about 40 μm. In example embodiments, a thickness in the vertical direction of a stacked structure including the first ink layer 102 and the second ink layer patterns 104a may be, e.g., 20 μm to 120 μm.

The second ink layer patterns 104a may be formed on the upper surface portions of the first ink layer 102 between portions on which the light emitting members 110 and the lenses 120 are mounted. That is, the second ink layer patterns 104a may be formed on the first ink layer 102 outside of the lenses 120. The second ink layer patterns 104a may be arranged so that a quantity of light at a portion adjacent to the light emitting members 110 and a quantity of light at a portion far from the light emitting members 110 may be uniform.

As shown in FIG. 6, the second ink layer patterns 104a may have the same size, e.g., width. The second ink layer patterns 104a may be disposed to have uniform intervals in at least one direction.

In some example embodiments, the second ink layer patterns 104a may have different sizes depending on positions. For example, as shown in FIGS. 7 and 8, the sizes of the second ink layer patterns 104a adjacent to the light emitting members 110 may be relatively great, e.g., the sizes of the second ink layer patterns 104a immediately adjacent to the light emitting members 110 may be larger than second ink layer patterns 104a farther from the light emitting members 110. As a distance from the light emitting members 110 increases, the sizes of the second ink layer patterns may decrease. In another example, the sizes of the second ink layer patterns 104a adjacent to the light emitting members 110 may be relatively small. As a distance from the light emitting members 110 increases, the sizes of the second ink layer patterns may increase.

In example embodiments, the second ink layer patterns 104a may have different intervals between the second ink layer patterns depending on the positions. For example, as shown in FIG. 9, the intervals between the second ink layer patterns 104a adjacent to the light emitting members 110 may be relatively great. As a distance from the light emitting members 110 increases, the intervals between the second ink layer patterns 104a may decrease. In another example, the intervals of the second ink layer patterns 104a adjacent to the light emitting members 110 may be relatively small. As a distance from the light emitting members 110 increases, the intervals of the second ink layer patterns 104a may increase.

However, the sizes and the intervals of the second ink layer patterns 104a may not be limited thereto, and may be variously modified in order to increase reflectivity.

Some of the light incident backward from the light emitting member 110 may be reflected at the upper surface of the second ink layer pattern 104a and an interface between the second ink layer pattern 104a and the first ink layer 102. In addition, some of the light incident backward from the light emitting member 110 may be reflected at the first ink layer 102. The quantity of reflected light of the light incident backward may be controlled by the size and the arrangement of the second ink layer patterns 104a. Thus, the light emitting device may have uniform luminance.

In some example embodiments, ink layer patterns may be further stacked on the second ink layer pattern 104a. The ink layer pattern may have a refractive index and/or a reflectivity different from a refractive index and/or a reflectivity of an ink layer pattern disposed immediately therebelow.

Figure 10:
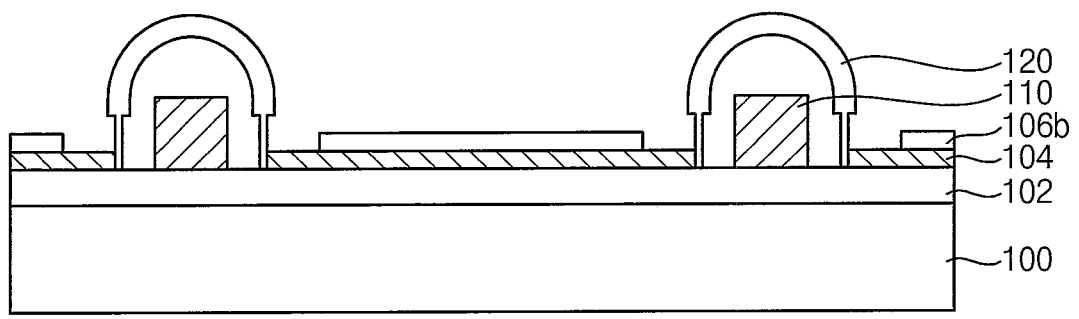
FIGS. 10 and 11 are a cross-sectional view and a plan view, respectively, of a light emitting device in accordance with example embodiments.
Figure 11:
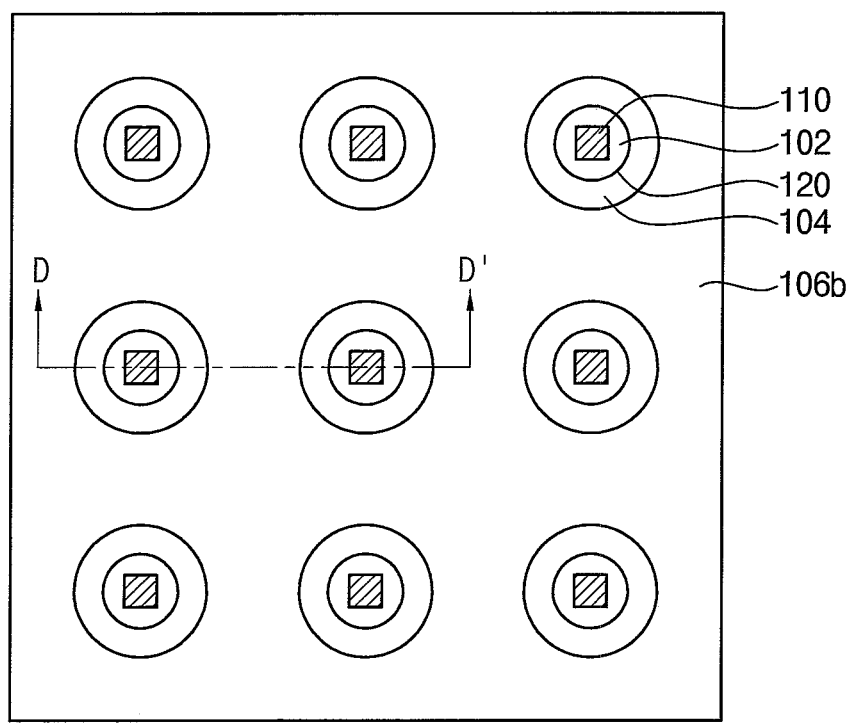

FIGS. 10 and 11 are a cross-sectional view and a plan view, respectively, of a light emitting device in accordance with example embodiments. FIG. 10 is a cross-sectional view along line D-D' of FIG. 11.

Referring to FIGS. 10 and 11, the light emitting device may include the PCB substrate 100, the first ink layer 102, the light emitting members 110, the second ink layer 104, a third ink layer pattern 106b, and the lenses 120.

The second ink layer 104 may be formed on the first ink layer 102. The first ink layer 102 and the second ink layer 104 may be substantially the same as those described previously with reference to FIGS. 1 and 2, respectively.

The third ink layer pattern 106b may have a third refractive index different from that of the second ink layer 104. Further, the third ink layer pattern 106b may have a third reflectivity different from that of the second ink layer 104.

The third ink layer pattern 106b may cover a portion of an upper surface of the second ink layer 104. In example embodiments, the third ink layer pattern 106b may be spaced apart from the lens 120 by a first distance. In this case, the third ink layer pattern 106b may include an upper opening having an inner width greater than an inner width of the opening of the second ink layer 104. The opening of the second ink layer 104 may be disposed inside the upper opening of the third ink layer pattern 106b, e.g., the opening and upper opening may be concentric and overlap each other along the vertical direction.

Ink layer patterns may be further stacked on the third ink layer pattern 106b. In this case, the ink layer patterns may cover a portion of the upper surface of the third ink layer pattern 106b. In example embodiments, a fourth ink layer pattern formed on the third ink layer pattern 106b may be spaced apart from the lens 120 by a second distance greater than the first distance. Thus, a stacked structure of the ink layer patterns may have a step shape, e.g., stair-profile, toward the side of the light emitting member 110.

As shown in FIG. 10, the first ink layer 102 and the second ink layer 104 may be stacked on a first portion corresponding to the first distance from the lens 120, e.g., the first portion may surround a perimeter of each lens 120. In addition, the first ink layer 102, the second ink layer 104, and the third ink layer pattern 106b may be stacked on a second portion, i.e., a portion immediately adjacent to the first portion, between the lenses 120, e.g., the second portion may be between two first portions. The number of stacked ink layers and/or ink layer patterns may be relatively small at the first portion close to the light emitting member 110, and the number of stacked ink layers and/or ink layer patterns may be increased as the distance from the light emitting member 110 increases, e.g., at the second portion.

However, the number of ink layers and/or ink layer patterns stacked may not be limited thereto. The number of ink layers and/or ink layer patterns stacked may be variously changed depending on positions.

In example embodiments, a plurality of ink layers having different refractive indices and/or reflectivities may be stacked on the first ink layer, and ink layer patterns may be formed on an uppermost ink layer. For example, an arrangement and a size of the ink layer patterns may be substantially the same as one of those illustrated with reference to FIGS. 6 to 9.

As described above, the ink layers and/or the ink layer patterns having different refractive indices and reflectivities may be formed on the PCB substrate 100. Thus, the light emitting device may have uniform luminance.

Figure 12:
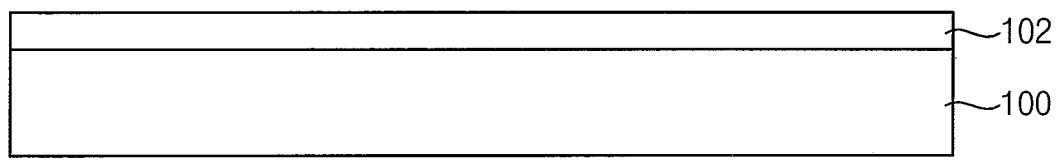
FIGS. 12 to 14 are cross-sectional views illustrating stages in a method of manufacturing a light emitting device in accordance with example embodiments.
Figure 13:
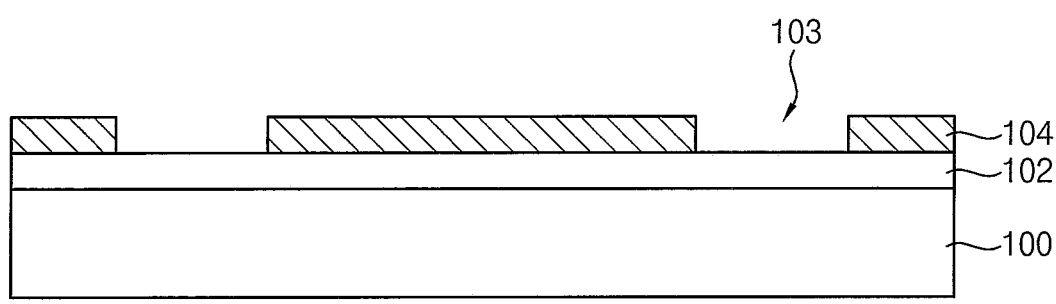
Figure 14:
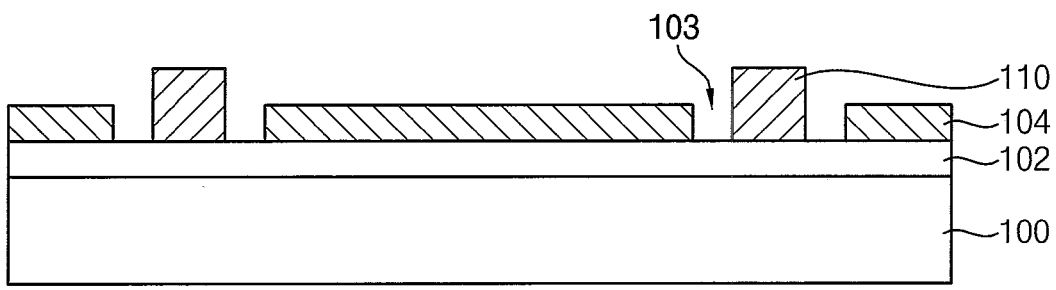
Figure 15:
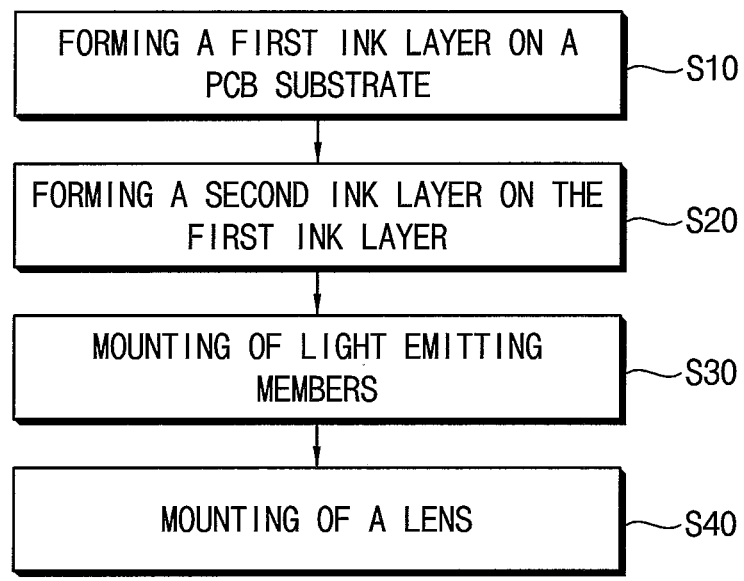
FIG. 15 is a flow chart showing a method of manufacturing a light emitting device in accordance with example embodiments.

FIGS. 12 to 14 are cross-sectional views illustrating stages in a method of manufacturing a light emitting device in accordance with example embodiments. FIG. 15 is a flow chart showing a method of manufacturing a light emitting device in accordance with example embodiments.

Referring to FIGS. 12 and 15, the PCB substrate 100 may be provided (S10). Next, the first ink layer 102 may be formed on the PCB substrate 100.

In example embodiments, the first ink layer 102 may be formed by a screen printing. The first ink layer 102 may cover an, e.g., entire, upper surface of the PCB substrate 100. The PCB substrate 100 may include an electrode for electrically connecting the light emitting member 110, and the electrode may be exposed by the first ink layer 102. In example embodiments, a curing and a hardening of the first ink layer 102 may be further performed by heating or lighting, after forming the first ink layer 102.

Referring to FIGS. 13 and 15, the second ink layer 104 may be formed on the first ink layer 102 (S20). The second ink layer 104 may not be formed on an upper surface of the first ink layer 102 on which the light emitting member 110 and the lens 120 are to be mounted.

The second ink layer 104 may include an opening 103 in which the light emitting member 110 and the lens 120 are to be mounted. The opening 103 of the second ink layer 104 exposes a portion of the first ink layer 102 on which the light emitting member 110 and the lens 120 are to be mounted.

In example embodiments, the second ink layer 104 may be formed by a screen printing. In some example embodiments, the second ink layer 104 may be formed by coating an ink layer and a removing of a portion of the ink layer by photo process to form the opening 103. In example embodiments, a curing and a hardening of the second ink layer 104 may be further performed by heating or lighting, after forming the second ink layer 104.

Referring to FIGS. 14 and 15, the light emitting members 110 may be mounted on the first ink layer 102 exposed by the opening 103 (S30). The light emitting members 110 may be electrically connected to the electrode of the PCB substrate 100.

Referring to FIGS. 1 and 15, the lenses 120 may be mounted on respective light emitting members 110 on the first ink layer 102 exposed by the openings 103 (S40). By performing the above process, the light emitting device shown in FIGS. 1 and 2 may be manufactured.

In some example embodiments, when the lens is not mounted, the light emitting device shown in FIGS. 3 and 4 may be manufactured.

The light emitting device shown in FIG. 5 may be formed by processes similar to those described above. In example embodiments, the processes illustrated with reference to FIGS. 12 and 13 may be performed, and then a third ink layer may be further formed on the second ink layer 104, e.g., in a similar process to that described with reference to the second ink layer 104. Thereafter, processes illustrated with reference to FIGS. 14 and 15 may be sequentially performed to manufacture the light emitting device shown in FIG. 5.

The light emitting device shown in FIGS. 6-11 may be formed by processes similar to those described above. In example embodiments, the process described with reference to 12 may be performed, and then a second ink layer pattern may be formed on the first ink layer 102. Thereafter, processes illustrated with reference to FIGS. 14 and 15 may be sequentially performed to manufacture one of the light emitting devices shown in FIGS. 6 to 9.

In example embodiments, the processes illustrated with reference to FIGS. 12 and 13 may be performed, and then a third ink layer pattern may be formed on the second ink layer 104. Thereafter, processes as illustrated with reference to FIGS. 14 and 15 may be sequentially performed to manufacture the light emitting device shown in FIGS. 10 and 11.

Figure 16:
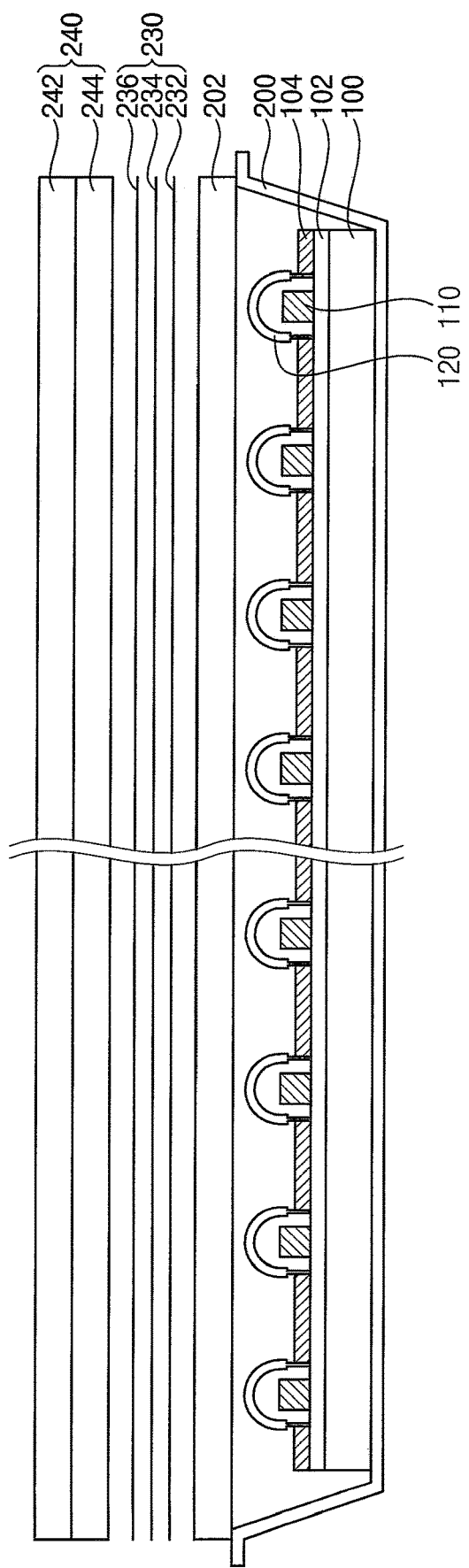
FIG. 16 is a cross-sectional view of a liquid crystal display module in accordance with example embodiments.

FIG. 16 is a cross-sectional view of a liquid crystal display module in accordance with example embodiments.

Referring to FIG. 16, the liquid crystal display module may include a liquid crystal panel 240, a backlight unit, and a lower cover 200.

The lower cover 200 may accommodate a light emitting device included in the backlight unit. The lower cover 200 may support a diffusion plate 202 and a plurality of optical sheets 230.

The liquid crystal panel 240 may display an image using light emitted from the backlight unit. The liquid crystal panel 240 may include a color filter substrate 242 and a thin film transistor substrate 244 facing each other with a liquid crystal interposed therebetween.

The backlight unit may be disposed under the liquid crystal panel 240, and may emit light to the liquid crystal panel 240. The backlight unit may include the light emitting device, the diffusion plate 202 and the plurality of optical sheets 230.

For example, the light emitting device may be one of the light emitting devices shown in FIGS. 1 to 11. In example embodiments, the light emitting device may include the PCB substrate 100, the first ink layer 102, the second ink layer 104, the light emitting members 110, and the lenses 120. Light generated by the light emitting member 110 in the light emitting device may irradiate to the diffusion plate 202. The light emitting members 110 may be mounted on the PCB substrate 100. The light emitting members 110 may be driven by a drive power supplied from an external source, and thus the light may be generated from the light emitting members 110.

The PCB substrate 100 may be disposed on the bottom surface of the lower cover 200 to face the diffusion plate 202. A driving power line for supplying the drive power may be formed on the PCB substrate 100. The drive power may be supplied into the light emitting members 110 through the driving power line on the PCB substrate 100, so that the light emitting members 110 may generate the light.

The first and second ink layers 102 and 104 on the PCB substrate 100 may have different refractive indices and/or reflectivities to each other, so that light traveling from the light emitting members 110 toward the lower cover 200 may reflect toward the liquid crystal panel 240. Therefore, a light efficiency of the light emitting members 110 may be improved.

The diffusion plate 202 may diffuse the light emitted from the light emitting members 110 so as to have a uniform distribution. Thus, the diffused light may be irradiated toward the plurality of optical sheets 230.

In example embodiments, the optical sheets 230 may include a light collecting sheet 132, a diffusion sheet 134, and a polarizing sheet 136. Light emitted from the diffusion plate 202 may be irradiated onto the liquid crystal panel 240 by the optical sheet 230.

The light emitting device included in the liquid crystal display module may have uniform luminance. Thus, in the liquid crystal display module, a moire phenomenon and/or a blur phenomenon may be reduced.

By way of summation and review, a quantity of light at a light emitting portion of a light emitting device may be different from a quantity of light at a non-light-emitting portion thereof. Thus, uniform light may not be emitted from an entire surface of a PCB substrate supporting the lighting device, thereby causing the light emitting device to have non-uniform luminance.

In contrast, example embodiments provide a light emitting device having uniform luminance. That is, in the light emitting device according to example embodiments, a reflective ink layer may be disposed between light emitting members, so a quantity of light may be greatly increased by reflection of light from the reflective ink layer in the non-light-emitting portion between the light emitting members. Thus, the light emitting device may have uniform luminance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device, comprising:
a printed circuit board (PCB) substrate;
a first ink layer covering the PCB substrate, the first ink layer having a first refractive index;
light emitters on the first ink layer; and
a second ink layer on the first ink layer and spaced apart from the light emitters, the second ink layer covering at least half a distance between adjacent ones of the light emitters, and the second ink layer having a second refractive index different from the first refractive index.

2. The light emitting device as claimed in claim 1, further comprising lenses covering the light emitters, the lenses being spaced apart from the light emitters, and each of upper and lower surfaces of the lenses having a semi-spherical shape.

3. The light emitting device as claimed in claim 2, wherein the second ink layer is on the first ink layer and outside of the lenses.

4. The light emitting device as claimed in claim 1, wherein the first ink layer has a first reflectivity, and the second ink layer has a second reflectivity different from the first reflectivity.

5. The light emitting device as claimed in claim 4, wherein the second reflectivity is higher than the first reflectivity.

6. The light emitting device as claimed in claim 1, wherein a difference between the first refractive index and the second refractive index is 0.1 or more.

7. The light emitting device as claimed in claim 1, wherein each of the first ink layer and the second ink layer has a thickness of about 10 μm to about 40 μm.

8. The light emitting device as claimed in claim 1, wherein each of the first and second ink layers independently includes an epoxy resin, a curing agent, and a pigment.

9. The light emitting device as claimed in claim 1, wherein each of the first and second ink layers independently includes a photo solder resist (PSR) ink.

10. The light emitting device as claimed in claim 1, further comprising an additional ink layer on the second ink layer, the additional ink layer having a refractive index different from the second refractive index of the second ink layer.

11. The light emitting device as claimed in claim 10, wherein the second ink layer is between the first ink layer and the additional ink layer, the second ink layer and the additional ink layer completely overlapping each other, and the additional ink layer having a highest reflectivity among the first ink layer, the second ink layer, and the additional ink layer.

12. The light emitting device as claimed in claim 2, wherein the second ink layer covers an entire surface of the first ink layer that is outside of the lenses.

13. The light emitting device as claimed in claim 12, further comprising third ink layer patterns on the second ink layer, the third ink layer patterns partially covering an upper surface of the second ink layer, and the third ink layer patterns having a third refractive index different from the second refractive index.

14. A light emitting device, comprising:
a printed circuit board (PCB) substrate;
a first ink layer covering the PCB substrate, the first ink layer having a first refractive index and a first reflectivity;
light emitters on the first ink layer;
lenses covering the light emitters, the lenses being spaced apart from the light emitters, and each of upper and lower surfaces of the lenses having a semi-spherical shape; and
a second ink layer on the first ink layer and continuously surrounding all the light emitters, the second ink layer being outside of the lenses, and the second ink layer having a second refractive index different from the first refractive index and a second reflectivity different from the first reflectivity.

15. The light emitting device as claimed in claim 14, wherein the second ink layer covers an entire upper surface of the first ink layer between adjacent ones of the lenses.

16. The light emitting device as claimed in claim 14, wherein an entirety of the second ink layer is outside the lenses.

17. The light emitting device as claimed in claim 14, wherein each of the first ink layer and the second ink layer has a thickness of about 10 μm to about 40 μm.

18. The light emitting device as claimed in claim 14, wherein a stacked structure including the first ink layer and the second ink layer has a total thickness of about 20 μm to about 120 μm.

19. A light emitting device, comprising:
a printed circuit board (PCB) substrate;
a first ink layer covering the PCB substrate, the first ink layer having a first refractive index and a first reflectivity;
light emitting diode (LED) packages on the first ink layer; and a second ink layer on the first ink layer and spaced apart from the LED packages, the second ink layer having a second refractive index different from the first refractive index and a second reflectivity higher than the first reflectivity, and a same second ink layer continuously surrounding a perimeter of each of the LED packages.

20. The light emitting device as claimed in claim 19, further comprising lenses on the first ink layer and spaced apart from the LED packages, the lenses covering the LED packages, and each of upper and lower surfaces of lenses lens having a semi-spherical shape.

* * * * *